(12) United States Patent
Tsou et al.

(10) Patent No.: US 6,509,219 B2
(45) Date of Patent: *Jan. 21, 2003

(54) FABRICATION OF NOTCHED GATES BY PASSIVATING PARTIALLY ETCHED GATE SIDEWALLS AND THEN USING AN ISOTROPIC ETCH

(75) Inventors: Len Y. Tsou, New City, NY (US); Hongwen Yan, Somers, NY (US); Qingyun Yang, Hopewell Junction, NY (US); Chienfan Yu, Highland Mills, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/928,212

(22) Filed: Aug. 10, 2001

(65) Prior Publication Data

US 2002/0132437 A1 Sep. 19, 2002

Related U.S. Application Data

(63) Continuation-in-part of application No. 09/811,707, filed on Mar. 19, 2001.

(51) Int. Cl.⁷ ............................................. H01L 21/336
(52) U.S. Cl. ...................... 438/197; 438/301; 438/303; 438/585; 438/595
(58) Field of Search ................................ 438/341, 305, 438/585, 300, 303, 589, 595, 197, 301

(56) References Cited

U.S. PATENT DOCUMENTS

| | | | |
|---|---|---|---|
| 4,403,396 A | | 9/1983 | Stein et al. |
| 4,689,869 A | | 9/1987 | Jambotkar et al. |
| 5,034,791 A | | 7/1991 | Kameyama et al. |
| 5,053,849 A | | 10/1991 | Izawa et al. |
| 5,236,549 A | * | 8/1993 | Shirakawa et al. ......... 156/643 |
| 5,286,665 A | | 2/1994 | Muragishi et al. |
| 5,302,536 A | * | 4/1994 | Josquin ....................... 438/585 |
| 5,405,787 A | | 4/1995 | Kurimoto |
| 5,514,621 A | * | 5/1996 | Tabara ......................... 438/585 |
| 5,547,883 A | | 8/1996 | Kim |

(List continued on next page.)

FOREIGN PATENT DOCUMENTS

WO WO 00/34984 6/2000

OTHER PUBLICATIONS

Ghani, et al., Portland Technology Development, QRE, TCAD, Intel Corporation, 100 nm Gate Length High Performance/Low Power CMOS Transistor Structure, vol. IEDM 99–415, IEEE (1999).

Pending patent application—09/811,707, filed Mar. 19, 2001, Ku.

*Primary Examiner*—Michael Trinh
(74) *Attorney, Agent, or Firm*—Todd M. C. Li; Scully, Scott, Murphy & Presser

(57) ABSTRACT

A method of forming a notched gate structure having substantially vertical sidewalls and a sub-0.05 μm electrical critical dimension is provided. The method includes forming a conductive layer on an insulating layer; forming a mask on the conductive layer so as to at least protect a portion of the conductive layer; anisotropically etching the conductive layer not protected by the mask so as to thin the conductive layer to a predetermined thickness and to form a conductive feature underlying the mask, the conductive feature having substantially vertical sidewalls; forming a passivating layer at least on the substantially vertical sidewalls; and isotropically etching remaining conductive layer not protected by the mask to remove the predetermined thickness thereby exposing a lower portion of said conductive feature not containing the passivating layer, while simultaneously removing notched regions in the lower portion of the conductive feature.

32 Claims, 2 Drawing Sheets

U.S. PATENT DOCUMENTS

| | | |
|---|---|---|
| 5,751,048 A | 5/1998 | Lee et al. |
| 5,776,821 A * | 7/1998 | Haskell et al. ............... 438/585 |
| 5,834,817 A * | 11/1998 | Satoh et al. ................. 257/387 |
| 5,866,473 A | 2/1999 | Xiang et al. |
| 5,895,273 A | 4/1999 | Burns et al. |
| 6,011,290 A | 1/2000 | Gardner et al. |
| 6,017,826 A | 1/2000 | Zhou et al. |
| 6,037,630 A | 3/2000 | Igarashi et al. |
| 6,060,733 A | 5/2000 | Gardner et al. |
| 6,074,960 A * | 6/2000 | Lee et al. .................... 438/749 |
| 6,103,603 A * | 8/2000 | Han ........................... 438/532 |
| 6,110,785 A | 8/2000 | Spikes, Jr. et al. |
| 6,306,715 B1 * | 10/2001 | Chan et al. ................. 438/305 |

\* cited by examiner

FABRICATION OF NOTCHED GATES BY PASSIVATING PARTIALLY ETCHED GATE SIDEWALLS AND THEN USING AN ISOTROPIC ETCH

RELATED APPLICATIONS

This application, which is a continuation-in-part application of U.S. application Ser. No. 09/811,707, filed on Mar. 19, 2001, allowed, which is related to co-assigned U.S. patent application Ser. No. 09/811,706, allowed, entitled "SELF-ALIGNED RAISED SOURCE DRAIN STRUCTURE AND PROCESS WITH OFFSET CONTROL USING NOTCH GATE PROCESS" which was also filed on Mar. 19, 2001. The related application is directed to the fabrication of MOSFET (metal oxide semiconductor field effect transistor) devices having a raised source/drain region to gain additional offset control, to lower the parasitic source/drain resistance and to improve the thermal management.

FIELD OF THE INVENTION

The present invention relates to semiconductor devices such as complementary metal oxide semiconductor (CMOS) devices and metal oxide semiconductor field effect transistor (MOSFET) devices, and more particularly to a method for fabricating gates having notched features at the bottom of the gate by utilizing processing steps that significantly reduce the product cycle time.

BACKGROUND OF THE INVENTION

As gate technology and particularly CMOS gate technology has advanced, the circuit elements of semiconductor devices have been designed to be smaller and more densely packed. One problem facing conventional gate technology is that lithographic masks used during the gate patterning process are incapable of forming very fine features.

Traditionally, a vertical sidewall has been an essential requirement for CMOS gates, which have been fabricated in the prior art by using a dry etch process such as reactive-ion etching (RIE). Relatively speaking, the merits of implementing a dry etch process are due mainly to its simplicity of controlling the plasmas and its result of producing more repeatable results than other processes, such as a wet etch method. Many plasma parameters, for example, gas pressure, chemistry, and the source and biased power can be varied/modified during the dry etch process to obtain anisotropic plasmas in order to produce a gate with a vertical sidewall structure.

Although the above-mentioned methodology has been performed in this industry for a long time and has become somewhat standardized globalwide, it is expected to encounter tremendous difficulties in achieving a vertical gate sidewall in developing technologies, especially for the sub-0.05 micron semiconductor technology.

It is important for device performance reasons to fabricate a gate having substantially vertical sidewalls. This is because vertical gate sidewalls ensure a fixed physical width of the interface that is present between the gate and the underlying dielectric film. Good process control is thus needed for providing a vertical gate profile having a fixed interface width between the bottom portion of the gate and the underlying dielectric film.

One future problem facing the fabrication of sub-0.05 micron semiconductor devices is controlling the vertical gate sidewall profile using a conventional approach with an anisotropic plasma etch. For example, the vertical gate profile may have an enlarged footing at the base of the gate with the underlying gate dielectric being intact if the etch selectivity is too high, or the etch can vertically punch through the gate dielectric and damage the underlying semiconductor substrate if the etch selectivity is too low. The process difficulty is aggravated primarily by the requirement for a very thin underlying gate dielectric thickness, which is driven by attempting to advance the device electrical performance. As the desired gate electrical critical dimension has become smaller, the problem of punching through the underlying gate dielectric has worsened.

In view of the above drawbacks with prior art gate fabrication processes, there is a continued need for providing a new and improved method that is capable of fabricating a semiconductor device such as a CMOS or MOSFET in which the gate region of the device has a sub-0.05 micron gate electrical critical dimension.

SUMMARY OF THE INVENTION

One object of the present invention is to provide a method of fabricating a semiconductor device such as CMOS or MOSFET in which the gate region has a sub-0.05 micron electrical critical dimension.

A further object of the present invention is to provide a method of fabricating a semiconductor device in which the gate region has substantially vertical sidewalls associated therewith.

A yet further object of the present invention is to provide a method of fabricating a semiconductor device utilizing processing steps that are compatible with existing CMOS processing steps.

An even further object of the present invention is to provide a method of fabricating a semiconductor device wherein the vertical profile is sufficiently controlled so as to allow fabrication of a gate having an interface between the gate and the underlying gate dielectric that has a controlled physical width.

A still further object of the present invention is to provide a method of fabricating a semiconductor device in which the gate electrical critical dimension (CD) is substantially reduced so as to improve the performance of the device.

These and other objects and advantages are achieved in the present invention by fabricating gate regions that have a notched feature at the bottom portion of the gate. Moreover, the inventive method is capable of forming notched gates having an upper portion that has substantially vertical gate sidewalls. The height of the vertical gate sidewall is controllable by the inventive process so as to make the height higher or lower depending on the specific device requirement. The phrase "substantially vertical gate sidewalls" as used herein denotes gate sidewalls that are essentially perpendicular to the substrate. In the present invention, substantially vertical sidewalls refer to gate sidewalls in the upper portion that have an angle from the substrate of greater than 88°, with angle of about 90° being more preferred. Note that the substantially vertical gate sidewalls of the semiconductor devices of the present invention are present above the notched gate region.

Specifically, the method of the present invention, which is employed in fabricating the above-mentioned notched gate, comprises the steps of:

(a) forming a conductive layer on an insulating layer that is present on a surface of a semiconductor substrate;

(b) forming a mask on said conductive layer so as to at least protect a portion of said conductive layer;

(c) anisotropically etching said conductive layer not protected by said mask so as to thin said conductive layer to a predetermined thickness and to form a conductive feature underlying said mask, said conductive feature having substantially vertical sidewalls;

(d) forming a passivating layer at least on said substantially vertical sidewalls, wherein said passivating layer is formed by a thermal growing process; and (e) isotropically etching remaining conductive layer not protected by said mask to remove said predetermined thickness thereby exposing a lower portion of said conductive feature not containing said passivating layer, while simultaneously removing notched regions in said lower portion of said conductive feature.

The thermal growing process used in forming the passivating includes rapid thermal growing conditions as well as furnace growing conditions.

DETAILED DESCRIPTION OF THE INVENTION

Figure 1:
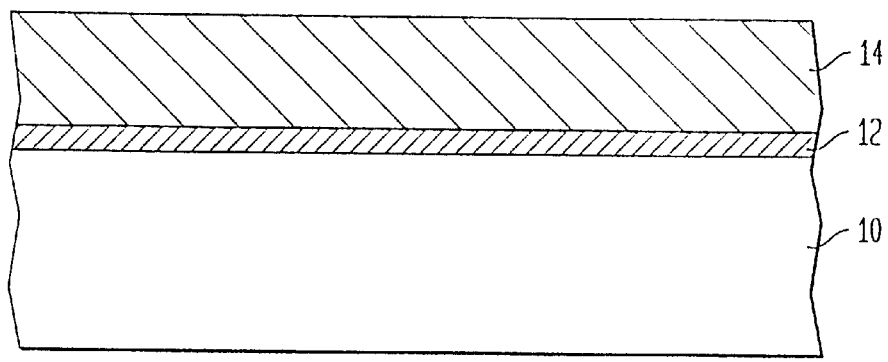
FIGS. 1–6 are pictorial representations (through cross-sectional views) showing the various processing steps of the present invention which provide notched gates having an interface between the gate and underlying gate dielectric that has a physical width of about 0.05 micron or less and substantially vertical gate sidewalls.

The present invention, which relates to a method of fabricating notched gates having the above-mentioned features, will now be described in more detail by referring to the drawings that accompany the present application. It is noted that in the accompanying drawings, like and/or corresponding elements are referred to by like reference numerals.

Reference is first made to FIG. 1 which shows an initial structure that is utilized in the present invention. The initial structure shown in FIG. 1 comprises semiconductor substrate 10, insulating layer 12 formed on a surface of substrate 10, and conductive layer 14 formed on insulating layer 12.

The structure shown in FIG. 1 is comprised of materials that are well known in the art and conventional processes that are also well known in the art are employed in fabricating the same. For example, semiconductor substrate 10 comprises any semiconducting material including, but not limited to: Si, Ge, SiGe, GaAs, InAs, InP and all other III/V compound semiconductors. Layered semiconductors comprising the same or different semiconducting material such as Si/Si, Si/SiGe and silicon-on-insulators (SOIs) may also be employed in the present invention as substrate 10. Semiconductor substrate 10 may be undoped or doped with an n or p-type dopant depending on the type of device to be fabricated.

The substrate may include various isolation regions such as shallow trench isolation (STI) regions or local oxidation of silicon (LOCOS) isolation regions formed in the surface thereof. For clarity, the drawings of the present invention do not specifically show the presence of the isolation regions; however, reference numeral 10 is meant to include those regions. One highly preferred semiconductor substrate employed in the present invention is a substrate that is comprised of Si.

Insulating layer 12 is then formed on a surface of substrate 10 utilizing a conventional deposition process such as chemical vapor deposition (CVD), plasma-assisted CVD, atomic layer CVD, evaporation, sputtering and chemical solution deposition. Alternatively, the insulating layer may be formed by a thermal oxidation, nitridation or oxynitridation process.

Insulating layer 12 is comprised of a conventional dielectric material including, but not limited to: oxides, nitrides, oxynitrides and mixtures or multilayers thereof. A highly preferred dielectric material that is employed in the present invention as insulating layer 12 is $SiO_2$. Note that the dielectrics employed in the present invention may have a higher or lower dielectric constant, k, than $SiO_2$. In one preferred embodiment of the present invention, high-k dielectrics such as perovskite-type oxides are employed as insulating layer 12.

The physical thickness of insulating layer 12 may vary, but typically the insulating layer has a thickness of from about 0.5 to about 20 nm, with a thickness of from about 1.0 to about 2.0 nm being more highly preferred. Note that a portion of the insulating layer will serve as the gate dielectric of the resultant semiconductor device.

After forming the insulating layer on a surface of the substrate, conductive layer 14 is formed on a surface of insulating layer 12. The conductive layer may be composed of any conventional conductive material including, but not limited to: elemental metals such as W, Pt, Pd, Ru, Re, Ir, Ta, Mo or combinations and multilayers thereof; suicides and nitrides of the foregoing elemental metals; doped or undoped polysilicon and combinations or multilayers thereof. One highly preferred conductive material employed as conductive layer 14 is doped polysilicon. Note that a portion of the conductive layer will serve as the gate conductor of the resultant semiconductor device.

Conductive layer 14 is formed utilizing a conventional deposition process such as CVD, plasma-assisted CVD, sputtering, evaporation, chemical solution deposition and plating. When metal silicides are employed, a conventional silicidation process may be employed in forming the same. On the other hand, when doped polysilicon is employed as conductive layer 14, the doped polysilicon may be formed by an in-situ doping deposition process, or alternatively a layer of undoped polysilicon is first deposited and thereafter conventional ion implantation is employed in doping the layer of polysilicon.

The physical thickness of conductive layer 14 formed in the present invention may vary depending on the conductive material employed as well as the process used in forming the same. Typically, however, conductive layer 14 has a thickness of from about 20 to about 400 nm, with a thickness of from about 50 to about 200 nm being more highly preferred. Note that this thickness represents a first thickness which will be subsequently thinned to a reduced thickness which is less than the first thickness.

Figure 2:
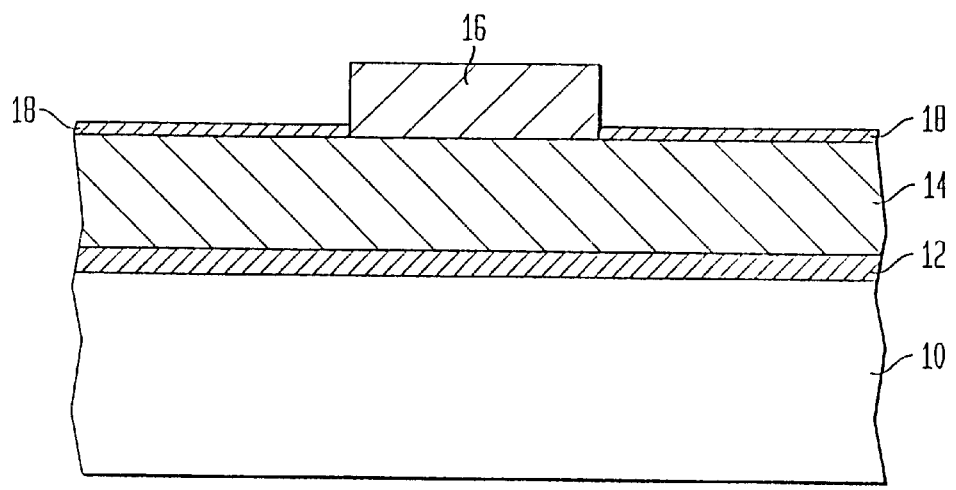

After forming the structure shown in FIG. 1, mask 16 is formed on a portion of the conductive layer providing a masked structure such as shown, for example, in FIG. 2. The mask protects underlying layers from subsequent etching processes and is used in defining the gate region of the structure.

In one embodiment of the present invention, mask 16 includes any conventional hardmask material such as an oxide, nitride, oxynitride and combinations or multilayers thereof which is applied and patterned using conventional processing steps well known in the art. For example, the hardmask material may be applied by utilizing a conventional deposition process such as CVD, plasma-assisted CVD, evaporation, chemical solution deposition and other like deposition processes. Alternatively, a conventional thermal growing process may be employed in forming the hardmask material.

Following application of the hardmask material, a layer of photoresist (not shown) is then formed on the hardmask material and that structure is subjected to conventional lithography which includes exposing the layer of photoresist to a pattern of radiation, developing the pattern by utilizing an appropriate developer solution, and transferring the pattern to the underlying hardmask material via a conventional dry etching process such as reactive-ion etching.

In another embodiment of the present invention, mask 16 is a conventional photoresist material that is patterned via lithography.

It is noted that although the drawings depict the formation of one masked region on the conductive layer, the present invention works when more than one masked region is formed on the conductive layer. Thus, the present invention is capable of forming a plurality of notched gates having substantially vertical sidewalls and gate electrical critical dimensions of about 0.05 micron or less.

In some embodiments of the present invention, native oxide 18 forms on the exposed surface of conductive layer 14. This native oxide, which is typically formed when the structure is exposed to air, is shown, for example, in FIG. 2. Note that under optimal vacuum conditions, the native oxide layer may not be formed on the exposed surface of the conductive layer.

In embodiments wherein a native oxide is present, a conventional etching process such as a low-pressure plasma with a high wafer-biased power is used to remove the native oxide layer present on top of the conductive layer. The role of the high wafer-biased power is to increase the ion bombardment energy impacting the wafer surface to improve the removal efficiency of the native oxide layer.

Following formation of the mask on a portion of the conductive layer and removal of the native oxide, the structure is then subjected to an anisotropic etching step in which the conductive layer not protected by the mask is thinned to a predetermined thickness, which is reduced from the first thickness mentioned above. Moreover, this anisotropic etching step also forms a conductive feature underlying the mask. In accordance with the present invention, the conductive feature formed in the present invention at this point of the inventive method has substantially vertical sidewalls. The structure containing thinned conductive layer 15 and conductive feature 20 having substantially vertical sidewalls 22 is shown, for example, in FIG. 3. Note that the conductive feature includes the masked portion of conductive layer 14.

Figure 3:
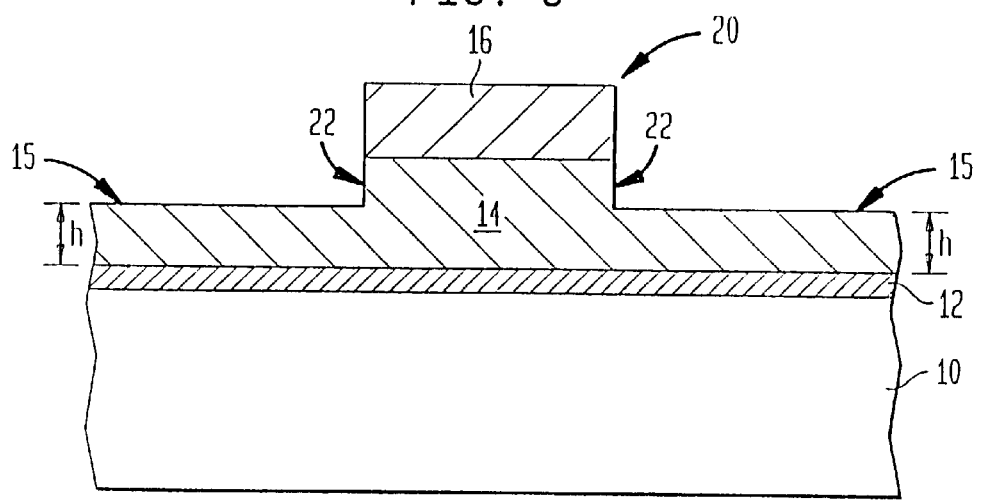

The anisotropic etching process used in this step of the present invention, which partially removes the conductive layer not protected by mask 16, includes any anisotropic etching process that can form the structure illustrated in FIG. 3. Typically, this anisotropic etching step includes the use of a halogen-containing plasma An example of a preferred anisotropic etching process that is employed in the present invention is a low-pressure (e.g., pressure of about 10 mTorr or less) HBr/$O_2$ plasma. Other suitable plasmas that may be used in the anisotropic etching step include, but are not limited to: fluorine-containing plasmas or chlorine-containing plasmas. Note that this etching step determines the notched height, h, of the gate, wherein the notched height, h, is defined as the height at which the gate starts to be notched to the bottom of the gate.

Figure 6:
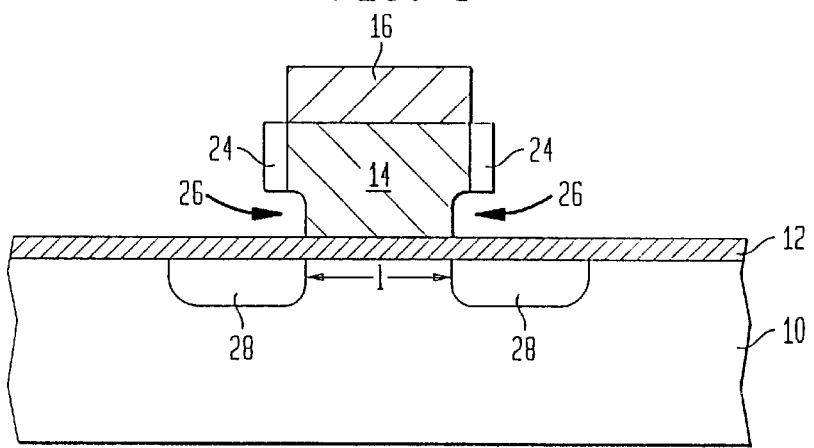

The notch height, h, as shown in FIG. 3 is related to the channel length, l, as shown in FIG. 6. The dimensions of the notch height, h, and channel length, l, are important for reasons explained hereinabove, and also because they effect the ability to perform other processing steps such as the implanting of ions to provide conduction. By adjusting the etch time of this step, various notched heights of the gate may be obtained.

Figure 4:
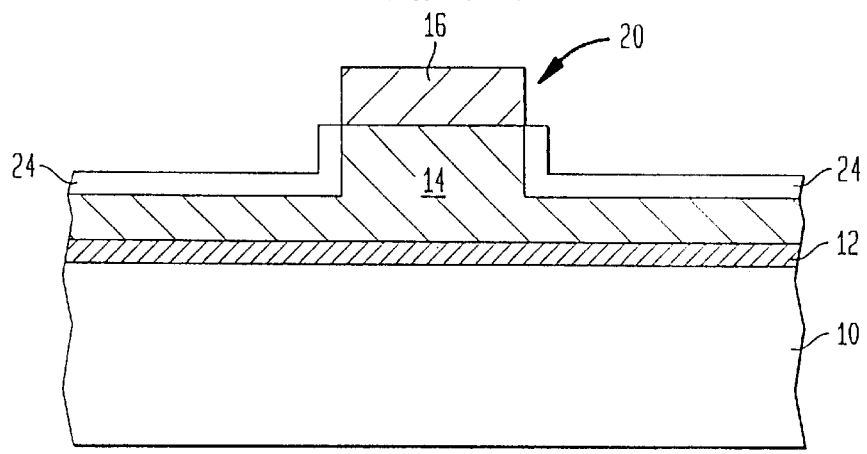

Following the above-mentioned partial etching of the conductive layer, passivating layer 24 is formed at least on substantially vertical sidewalls 22 of the previously formed conductive feature 20. In some embodiments of the present invention, the passivating layer may also be formed on thinned conductive layer 15. The structure including passivating layer 24 on substantially vertical sidewalls 22 and the horizontal surface of thinned conductive layer 15 is shown, for example, in FIG. 4.

The passivating layer employed in the present invention includes any insulating material that is resistant to removal by a subsequent etching step of the present invention. Illustrative examples of such passivating layers include, but are not limited to: oxides, nitrides, oxynitrides and mixtures or multilayers thereof. The thickness of the passivating layer may vary depending on the type of insulating material employed as well as the process that is employed in forming the same. Typically, the thickness of the passivating layer is from about 2.0 to about 15 nm, with a thickness of from about 3.0 to about 5.0 nm being more highly preferred.

The passivating layer may be formed by various deposition processes such as CVD, plasma-assisted CVD, evaporation and sputtering, or alternatively a thermal oxidation, nitridiation or oxynitridation process may be employed in forming the passivating layer.

In one preferred embodiment of the present invention, a high-pressure (e.g., pressure of from about 20 to about 100 mTorr) $O_2$ plasma is used to passivate all substantially vertical sidewalls 22 and horizontal surfaces of the thinned conductive layer that are exposed to the $O_2$ plasma. Note that the sidewalls of the conductive feature are protected by the passivation layer, therefore the vertical profile thereof is preserved during a subsequent notch-forming etch step.

In another preferred embodiment of the present invention, the passivating layer is formed by a thermal growing process, e.g., by thermal oxidation, nitridation or oxynitridation, which can be carried out using rapid thermal conditions or by using furnace conditions.

When a thermal oxidation process is employed, the ambient employed includes an oxygen-containing gas such as $O_2$, air, ozone, NO, $NO_2$ and other like oxygen-containing gases. Mixtures of the aforesaid oxygen-containing gases are also contemplated herein. The oxygen-containing gas may be used alone, or it may be admixed with an inert gas such as He, Ar, $N_2$, Kr, Xe or mixtures thereof.

When a thermal nitridation process is employed in forming the passivating layer, the ambient employed includes any nitrogen-containing gas such as $N_2$, $NH_3$, NO, $NO_2$ and other like nitrogen-containing gases. Mixtures of the aforesaid nitrogen-containing gases are also contemplated herein. The nitrogen-containing gas may be used alone, or it may be admixed with an inert gas such as He, Ar, $N_2$, Kr, Xe or mixtures thereof.

When a thermal oxynitridation process is employed in forming the passivating layer, the passivating layer may be formed by nitridation of a previously formed oxidation layer; or oxidation of a previously formed nitridation layer.

Notwithstanding the type of ambient gas employed, the thermal oxidation, nitridation or oxynitridation process may be carried out using rapid thermal growing conditions or, alternatively, furnace growing conditions may be employed.

When rapid thermal growing conditions are employed, the oxidation, nitridation or oxynitridation process is carried out at a temperature of about 700° C. or greater for a time period of from about 200 seconds or less. More specifically, the rapid thermal growing process is carried out at a temperature of from about 900° to about 1100° C. for a time period of from about 60 to about 120 seconds.

When furnace conditions are employed, the passivating layer is formed at a temperature of about 800° C. or greater, for a time period of from about 20 minutes or greater. More specifically, the furnace growing process is carried out at a temperature of from about 900° to about 1000° C. for a time period of from about 30 to about 60 minutes.

Note that when a thermal oxidation, nitridation, oxynitridation process is employed in forming the passivating layer, then passivating layer 24 will be composed of a thermal oxide, thermal nitride or thermal oxynitride film.

Figure 5:
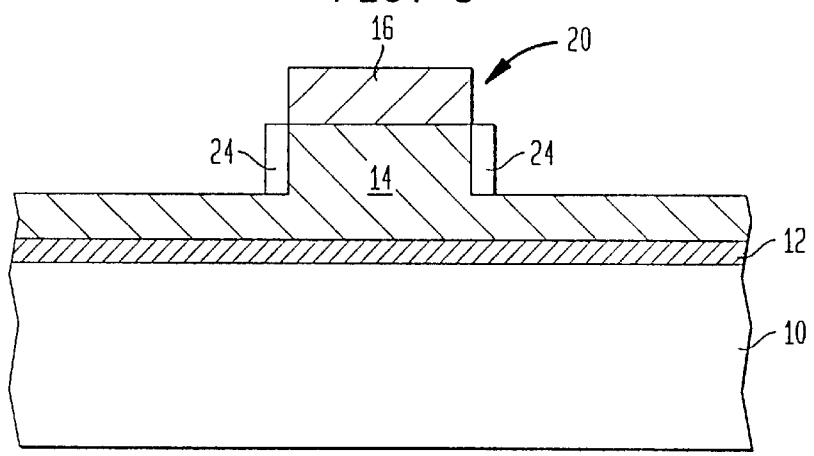

In embodiments wherein the passivating layer is formed on the thinned conductive layer, an anisotropic etching process such as a high-bias $HBr/O_2$ anisotropic plasma is used for breaking through and removing the passivating layer that is present on the horizontal thinned conductive layer. It is noted that the anisotropic etching process employed in this step of the present invention removes only the passivating layer that is formed on the horizontal surface of the thinned conductive layer. The anisotropic etching step does not, however, remove the passivating layer from the substantially vertical sidewalls of the conductive feature. The structure formed after this etching step is shown, for example, in FIG. 5. Note that when the passivating layer is formed on only the substantially vertical sidewalls of the conductive feature, this step may be omitted.

The next step of the present invention comprises an isotropic etching process that removes the remaining thinned conductive layer not protected by the mask exposing a lower portion of the conductive feature not containing the passivating layer, while simultaneously removing notched regions in the lower portion of the conductive feature. The resultant structure including notched region 26 is shown, for example, in FIG. 6. Note that notched region 26 is formed below the previously formed substantially vertical sidewalls of the gate region.

In a preferred embodiment of the present invention, this etching step employs a high-pressure (e.g., a pressure of from about 20 to about 100 mTorr) $HBr/Cl_2/O_2/N_2$ isotropic plasma to form notched region 26. Although various conditions may be employed in the $HBr/Cl_2/O_2/N_2$ isotropic etch, the following represent some preferred conditions that may be employed in the present invention: HBr flow rate of approximately 150 sccm; $Cl_2$ flow rate of approximately 20 sccm; $O_2$ flow rate of approximately 2.5 sccm; and $N_2$ flow rate of approximately 3–5 sccm; source power of about 500 to about 1000 watts; and an ultra low wafer-biased power of from about 0 to about 70 watts.

In some embodiments, this isotropic plasma process is carried out in a plasma that does not include $Cl_2$; non-$Cl_2$ plasma maintain the integrity of the gate region.

As stated above, this etching step is used for etching away the remaining thinned conductive layer to form the gate structure illustrated in FIG. 6, while simultaneously forming a notch into the gate line below the remaining sidewall passivation layer to form the notched regions at the bottom portion of the conductive feature.

Note that halogen species are typically employed in this etching step since they are capable of etching the conductive layer as well as forming the notched features. Nitrogen gases are also typically employed in this etching step since they reduce the etch loading effect, and also slow down the lateral etch rate during the notch formation etch process. Although nitrogen is a preferred gas, other inert gases such as helium or argon might possibly perform the same functions.

It is noted that all of the processing steps mentioned above may be performed in multiple reactors, or more preferably, the processing steps of the present invention are carried out in a single reactor. The use of a single reactor is preferred herein since it significantly reduces the product cycle time and cost of manufacturing the notched gate structure.

A conventional angle implant may be performed at this stage of the present invention to form source/drain extension regions in the substrate at the foot of the notched gate region. Note that FIG. 6 shows the presence of source/drain extension regions 28 in the substrate.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention is not limited to the exact forms and details described and illustrated, but fall within the scope of the appended claims.

Having thus described our invention in detail what we claim as new and desire to secure by the Letters Patent is:

1. A method of fabricating a notched gate structure comprising the steps of:
    (a) forming a conductive layer consisting essentially of a uniform material on an insulating layer that is present on a surface of a semiconductor substrate;
    (b) forming a mask on said conductive layer so as to at least protect a portion of said conductive layer;
    (c) anisotropically etching said conductive layer not protected by said mask so as to thin said conductive layer to a predetermined thickness and to form a conductive feature underlying said mask, said conductive feature having substantially vertical sidewalls;
    (d) forming a passivating layer at least on said substantially vertical sidewalls, wherein said passivating layer is formed by a thermal growing process; and
    (e) isotropically etching remaining conductive layer not protected by said mask to remove said predetermined thickness thereby exposing a lower portion of said conductive feature not containing said passivating layer, while simultaneously removing notched regions in said lower portion of said conductive feature.

2. The method of claim 1 wherein steps (a)–(e) are performed in a single reactor.

3. The method of claim 1 wherein said conductive layer comprises an elemental metal, a silicide or nitride of an elemental metal, doped polysilicon, undoped polysilicon or combinations and multilayers thereof.

4. The method of claim 3 wherein said elemental metal comprises W, Pt, Pd, Ru, Re, Ir, Ta, Mo or combinations thereof.

5. The method of claim 1 wherein said conductive layer is formed by a deposition process selected from the group consisting of chemical vapor deposition (CVD), plasma-assisted CVD, sputtering, evaporation, chemical solution deposition and plating.

6. The method of claim 1 wherein said conductive layer is doped polysilicon which is formed by an in-situ doping deposition process.

7. The method of claim 1 wherein said insulating layer comprises an oxide, a nitride, an oxynitride or mixtures and multilayers thereof.

8. The method of claim 1 wherein said insulating layer comprises a dielectric material that has a dielectric constant that is greater than $SiO_2$.

9. The method of claim 1 wherein said insulating layer has a thickness of from about 0.5 to about 20 nm.

10. The method of claim 9 wherein said insulating layer has a thickness of from about 1.0 to about 2.0 nm.

11. The method of claim 1 wherein step (b) comprises the steps of forming a hardmask material on said conductive layer and lithographically forming a pattern in said hardmask material.

12. The method of claim 1 wherein said mask is a lithographically patterned photoresist.

13. The method of claim 1 wherein step (c) includes a halogen-containing plasma.

14. The method of claim 1 wherein step (c) includes a low-pressure $HBr_2/O_2$ plasma.

15. The method of claim 1 wherein said passivating layer comprises an oxide, nitride, oxynitride or combinations and multilayers thereof.

16. The method of claim 1 wherein said passivating layer is further formed on said thinned conductive layer.

17. The method of claim 1 wherein said thermal growing process is carried out using rapid thermal growing process or furnace growing process.

18. The method of claim 17 wherein said rapid thermal growing process is carried out at a temperature of about 700° C. or greater for a time period of from about 200 seconds or less.

19. The method of claim 18 wherein said rapid thermal growing process is carried out at a temperature of from about 900° to about 1100° C. for a time period of from about 60 to about 120 seconds.

20. The method of claim 17 wherein said furnace growing process is carried out at a temperature of about 800° C. or greater, for a time period of from about 20 minutes or greater.

21. The method of claim 20 wherein said furnace growing process is carried out at a temperature of from about 900° to about 1000° C. for a time period of from about 30 to about 60 minutes.

22. The method of claim 1 wherein said passivating layer is a thermal oxide.

23. The method of claim 1 wherein step (e) comprises the use of an etching plasma that includes at least a halogen species.

24. The method of claim 23 wherein said halogen species is chlorine.

25. The method of claim 23 wherein said etching plasma further comprises an inert gas.

26. The method of claim 25 wherein said inert gas is a nitrogen gas.

27. The method of claim 23 wherein said etching plasma further comprises oxygen.

28. The method of claim 1 wherein step (e) comprises a high-pressure $HBr/Cl_2/O_2/N_2$ plasma.

29. A method of forming a notched gate structure comprising:

forming a gate conductor layer consisting essentially of a uniform material having a first thickness;

patterning a mask over said gate conductor layer;

etching said gate conductor layer in regions not protected by said mask to a reduced thickness, wherein said reduced thickness is less than said first thickness;

forming an oxidized layer over vertical portions of said gate conductor layer; and forming undercut notches within said gate conductor layer at lower corners of said gate conductor layer.

30. The method of claim 29 wherein said forming of said oxidized layer includes:

oxidizing the said gate conductor layer; and removing said oxidized layer from horizontal portions of said gate conductor layer.

31. The method of claim 30 wherein said removing is performed with using an anisotropic etch.

32. A method of forming a notched gate structure comprising;

forming a gate conductor layer consisting essentially of a uniform material on a gate dielectric layer, said gate conductor layer having a first thickness;

patterning a mask over said gate conductor layer; etching said gate conductor layer in regions not protected by said mask to a reduced thickness, wherein said reduced thickness and less than said first thickness;

oxidizing said gate conductor layer to produce an oxidized layer;

removing said oxidized layer from horizontal portions of said gate conductor layer; and selectively etching said gate conductor layer to remove said gate conductor layer from regions not protected by said mask or said oxidized layer, thereby forming undercut notches within said gate conductor layer at corner locations where said gate conductor meets said gate dielectric layer.

* * * * *